(12) United States Patent
Saperov et al.

(10) Patent No.: US 6,256,652 B1
(45) Date of Patent: *Jul. 3, 2001

(54) BINARY CODE COMPRESSION AND DECOMPRESSION AND PARALLEL COMPRESSION AND DECOMPRESSION PROCESSOR

(75) Inventors: Anatoly Grigorjevich Saperov; Nikolay Felixovich Krot, both of Mogilev (BY)

(73) Assignees: Jury P. Milto; Vadium V. Djachkov; Anatoly G. Saperov, all of Mogilev (BY)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/952,039
(22) PCT Filed: Jul. 29, 1996
(86) PCT No.: PCT/BY96/00006
  § 371 Date: Nov. 6, 1997
  § 102(e) Date: Nov. 6, 1997
(87) PCT Pub. No.: WO97/40581
  PCT Pub. Date: Oct. 30, 1997

(30) Foreign Application Priority Data

Apr. 18, 1996 (BY) .................................................. 960192

(51) Int. Cl.[7] ................................. G06F 7/00; H03M 7/30
(52) U.S. Cl. ......................................................... 708/203
(58) Field of Search ..................................... 708/203, 400, 708/603

(56) References Cited

U.S. PATENT DOCUMENTS 4,503,510 * 3/1985 Weaver ................................. 708/203
5,126,739 * 6/1992 Whiting et al. ....................... 341/106

FOREIGN PATENT DOCUMENTS

1325718 * 7/1987 (RU) .

* cited by examiner

Primary Examiner—Ohuong Dinh Ngo
(74) Attorney, Agent, or Firm—Francis C. Hand, Esq.; Carella, Byrne, Bain, Gilfillan, Cecchi, Stewart & Olstein

(57) ABSTRACT

A method and corresponding apparatus for compressing a binary code includes converting an initial flow of data through serial multiplication of values of bits of a signal to be coded, receiving an a coding function, and summing all products of the serial multiplication for a predetermined period of time. The method further provides that discrete values of the coding function are used as the coding function, the coding function is a piecewise continuous function in a form of a Gaussian pulse with a frequency fill, computations of a Duamel sequence are used during conversion of the code, and the initial data and discrete values of the coding function are used as arguments of the sequence. To decompress the compressed code, inverse transformation utilizes an orthogonal coding function, with the improvement that decoded values are subtracted from undecoded compressed data, remaining values during subtraction are used to superposition the initial data flow and corresponding values of the Gaussian pulse within a section of a polynomial function, the remaining values are transformed to the initial data flow using predetermined conversion tables, and new values of an initial, decompressed function are set with a correspondence for serial values of the function that remains after subtraction.

7 Claims, 5 Drawing Sheets

METHOD OF COMPRESSION AND
DECOMPRESSION OF CODE
AND PROCESSOR

METHOD OF COMPRESSION AND
DECOMPRESSION OF CODE
AND PROCESSOR

METHOD OF COMPRESSION AND
DECOMPRESSION OF CODE
AND PROCESSOR

METHOD OF COMPRESSION AND
DECOMPRESSION OF CODE
AND PROCESSOR

BINARY CODE COMPRESSION AND DECOMPRESSION AND PARALLEL COMPRESSION AND DECOMPRESSION PROCESSOR

BACKGROUND OF THE INVENTION

1. Field of the Invention

This invention relates to computer technology and can be particularly used to compress the binary code in the devices of processing, storage, transmitting, receiving and recording as well as in information systems, for example, communication and multimedia systems.

2. Description of the Related Art

Known are the methods of compressing the binary code for its transmission through the communication channels. These methods include the translation of the initial binary code to a compressed data flow by orthogonal functions which is effected in synchronous multiplication of each initial code bit by corresponding readings of the orthogonal function used (see F. Hartmouth. Transmitting Information by Orthogonal Functions.—Moscow, Svjaz, 1975; Abmed, Nasir, Rao, Kamiseti-Ramamahan. Orthogonal Transformations in Processing of Digital Signals.—Transl. fm English by T. E. Krenel.—Moscow: Svjaz, 1980; S. A. Kuritsyn, E. P. Perfiliev, V. I. Ponomarev. Formation of Signal Spectrum at Data Transmittance. Electrosvjaz, 1975, 12, 41–46).

Also known are the methods of compressing the binary code for its recording to data storage devices, such as floppy or hard disks, which include the transformation of a data flow to a compressed code by using one of the known codes of compression, in particular, a method using "prediction" coding (see U.S. Pat. No. 5,146,221 MPK$^5$ H03M 13/00 publ.8.09.1992; U.S. Pat. No. 5,126,736 MPK$^5$ H03M 13/00 publ.17.09.1992).

The deficiency of these known methods is a low degree of compression, which varies from about 20 to 80 percent of the initial binary code length, as well as a contradiction which appears between the degree of compression and the pass band of the channel used (track), loss of information (data).

There are methods of compressing data with loss of information, for example, compressing videoimage (laser disks, multimedia). Considering that the information to be transmitted is specific, they allow to suppress the relative (subjective) excessiveness of information. Such algorithms allow to reach the degree of compression of 400 to 4,000 percent. However, such methods are not considered here, as the task set does not allow any loss of information.

As a prototype for the method of compressing the binary code, a method was selected, which includes the transformation of the initial binary data flow by an orthogonal function, which is effected by multiplying the initial binary code by the corresponding readings of the basis function with subsequent summation, and the sums received are transformed to an analogue signal with a predefined frequency spectrum (see B. V. Fesenko, A. D. Chemavin. Modem in KAMAK Standard with a Digital Mode of Forming a Signal.—Avtometria, 1980,4, pp.24–28).

The deficiency of this method is a low degree of signal compression due to the dependence of compression degree on the frequency of the carrier signal. According to Kotelnikov's Theorem, on the increase of the compression degree, the frequency of the carrier is proportionally increased, hence, the public communication lines can be used with limitations for computer communications.

As a prototype of the method of decompression a method has been chosen which is effected by inverse transformation of signal by an orthogonal function with subsequent averaging of signal within predefined time interval. (V. A. Tamm, P. G. Fritzler, Method of Suppressing Discontinuous Jamming and Short-time Intermissions at Data Transmittance.—Electrosvjaz, 1984, 10, pp.52–55).

As a prototype of a compression and decompression processor, the processor has been chosen which comprises an arithmetic and logic unit (ALU), random access memory (RAM), control unit (CU), data registers (DR) and exchange registers (ER) (Lestes, Sanders. Monocrystal Coder-Decoder for Code Translation without Return to Manchester Code Zero.—Electronica, 1982, 15; U.S. Pat. No. 5,126,739 MPK$^5$ H03M 13/00 publ.17.09.1992).

The deficiency of this processor prototype is a stiff connection of the spectral band to the speed of data transmission (compression degree), resulting in the necessity of expansion of spectrum of signal passing through the track during the transmission, whereas this in turn needs special communication lines or leads to information losses in usual communication lines.

SUMMARY OF THE INVENTION

The task being fulfilled by this invention is to considerably increase (by more than 100–500 times) the compression degree of information transmitted by parallel or serial binary code with high speed of processing (compression) and data information storage under conditions of a noisy track, speeding up the signal coding and decoding with no considerable increase of the carrier frequency.

The task thus set is fulfilled by using, in the known method of binary code compression including transformation of initial data flow by serial multiplication of signal bits to be coded by readings of orthogonal coding function and summation of all products for some time period, according to this invention, as a coding function, of discrete values of function which actually is a piecewise continuous function in form of a Gaussian pulse with frequency filling, and as a coding transformation, a computation of Duamel sequence is used, whereas the data input flow and discrete values of the coding function are used as arguments of this sequence.

The problem is also solved by changing the frequency of Gaussian pulse fill according to exponential law, and the phase in each impulse point is computed as an integral of the frequency filling, whereas of all Gaussian pulse duration at coding only the section approximated by a polynomial function with the polynomial degree not lower than four is used.

The problem is also solved by computing the Duamel sequence on principle of superposition of data initial flow and corresponding values of Gaussian pulse.

The problem is also solved by putting correspondence of the serial input data flow to serial values of the piecewise continuous Gaussian pulse, and the process of computing of Duamel sequence is done parallel-serially, whereas deparalleling of the process of data initial flow compression is effected by impulse processing overlap.

The problem is also solved by using, according to this invention, in a known method of the binary code decompression including the inverse transformation of the compressed values by an orthogonal coding function, as decoding, of the process of bit by bit subtraction of decoded values from undecoded compressed ones, and the remaining values are used to superposition of the data initial flow and the corresponding values of Gaussian pulse within the section of a polynomial function, whereas the remaining values are transformed to the data initial flow by conversion tables, setting several new values of the decompressed (initial) function with a correspondence for several serial values of the function remained after subtraction.

The problem is also solved in parallel compression and decompression processor, comprising an arithmetic and logic unit, random access memory, control unit, data registers and exchange registers by using, in accordance with this invention, as an random access memory, of a multiple-order shift register with input and output logic, besides, whereto a unit of forming codes for values of piecewise continuous Gaussian pulse is introduced.

The problem is also solved by using, in accordance with this invention, as an random access memory, of a multiple-order shift register with input and output logic, additionally are introduced an address counter and a unit to form values of piecewise continuous Gaussian pulse.

The problem is also solved by using a read only memory to store codes of values of piecewise continuous Gaussian pulse in form of tables and an address counter controlling a serial selection of values from the read only memory as a unit of forming codes of values of piecewise continuous Gaussian pulse.

The problem is also solved by using, as a unit of forming codes of values of piecewise continuous Gaussian pulse, of a specialized processor for computing the amplitudes of this function, which operates parallel to the basic processor.

BRIEF DESCRIPTION OF THE DRAWINGS

To illustrate the method.

DETAILED DESCRIPTION OF THE INVENTION

Figure 1:
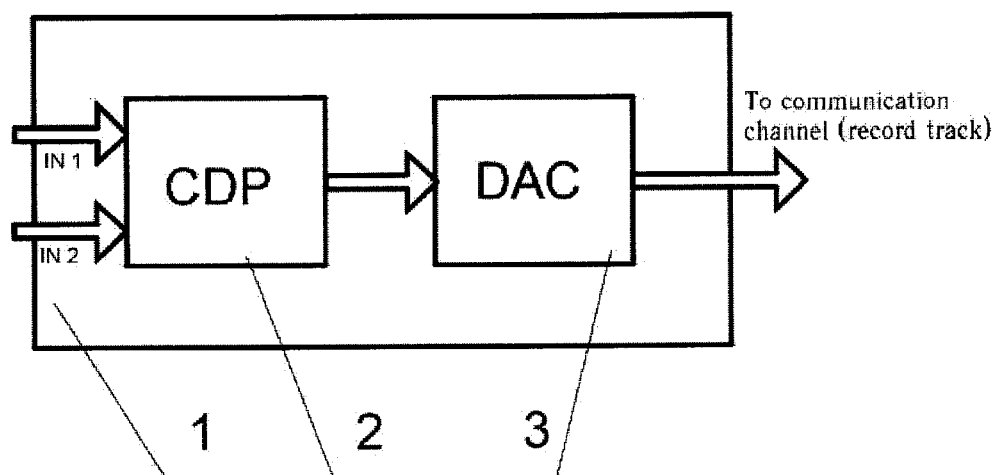
FIG. 1 shows a block diagram of a data compressor.

Compressor unit 1 (FIG. 1) comprises compression and decompression processor (CDP) 2 and digital-analogue converter (DAC) 3.

Figure 2:
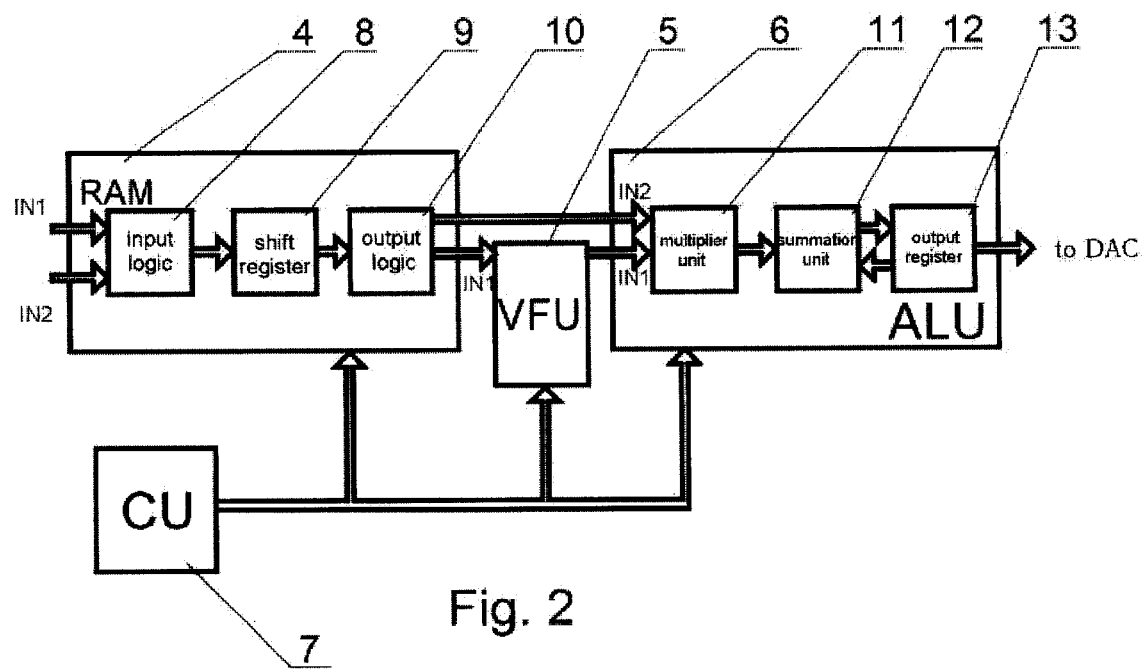
FIG. 2 shows the block diagram of a compression and decompression processor.

Compression and decompression processor CDP 2 (FIG. 2) consists of random access memory (RAM) 4, the input of which is fed by a non-compressed serial or parallel code, of unit, forming values of piecewise continuous Gaussian pulse (VFU) 5 to present codes of values of the used polynomial function, of arithmetic and logic unit (ALU) 6 for fulfilling operations of algebraic summation and multiplication of a non-compressed code and codes of values of the used polynomial function, as well as of control unit (CU) 7.

In its turn, RAM 4 consists of input logic 8, multiple-order shift register 9 and output logic 10. ALU 6 comprises multiplier unit 11, summation unit 12 and output register 13.

Figure 3:
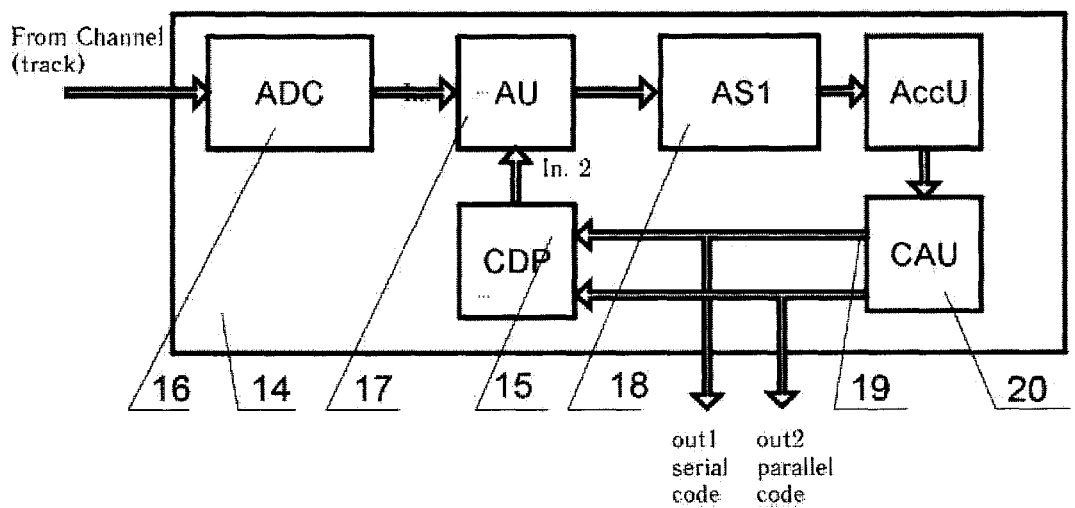
FIG. 3 illustrates a data decompression unit structure.
Figure 4:
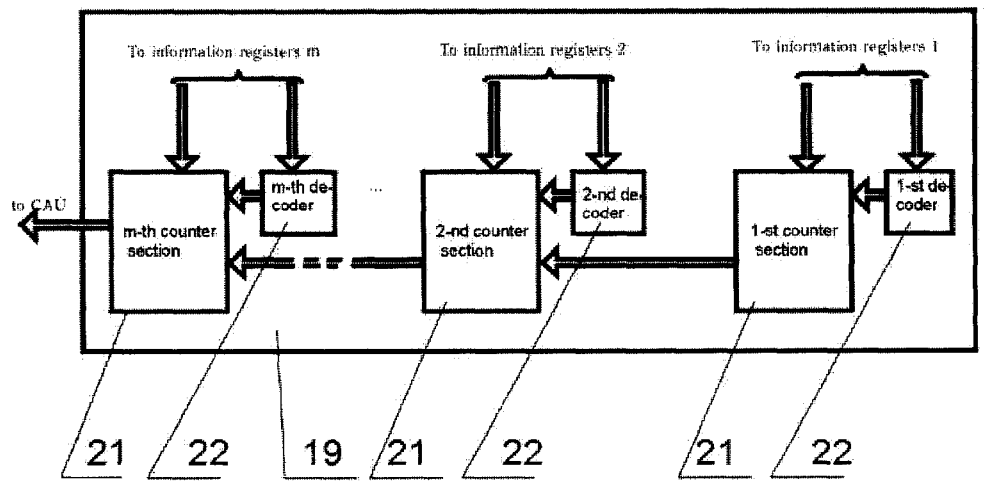
FIG. 4 shows the structure of the accumulators unit.

Decompressor 14 (FIG. 3) includes compression and decompression processor 15, similar to CDP 2, analogue-digital converter (ADC) 16 to convert an analogue signal to a compressed code, arithmetic unit (AU) 17 to compute the distinction between the compressed code and the remaining part of the decompressed code, first associative storage (ASI), keeping the decoding codes in form of tables, accumulators unit 19 to sum up the decoded values of the initial code, and code analysing unit 20.

Accumulators unit 19 consists of m sections of binary counters 21 and m decoders 22.

Figure 5:
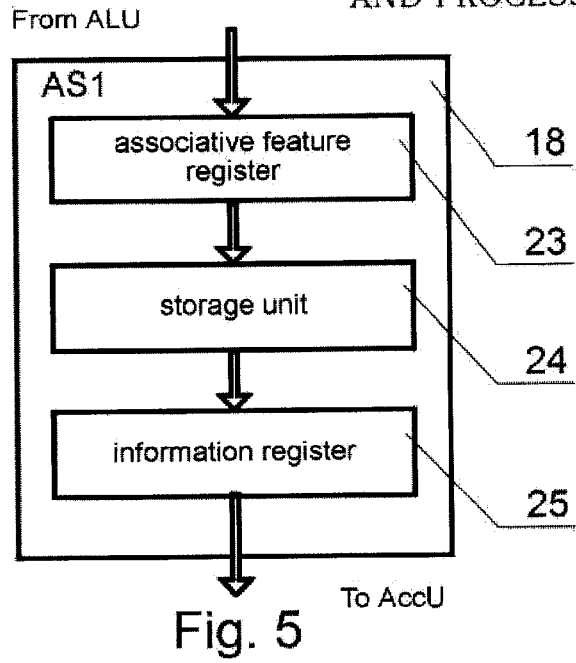
FIGS. 5,6 show the structures of associative storage ASI and an analysis unit, correspondingly.
Figure 6:
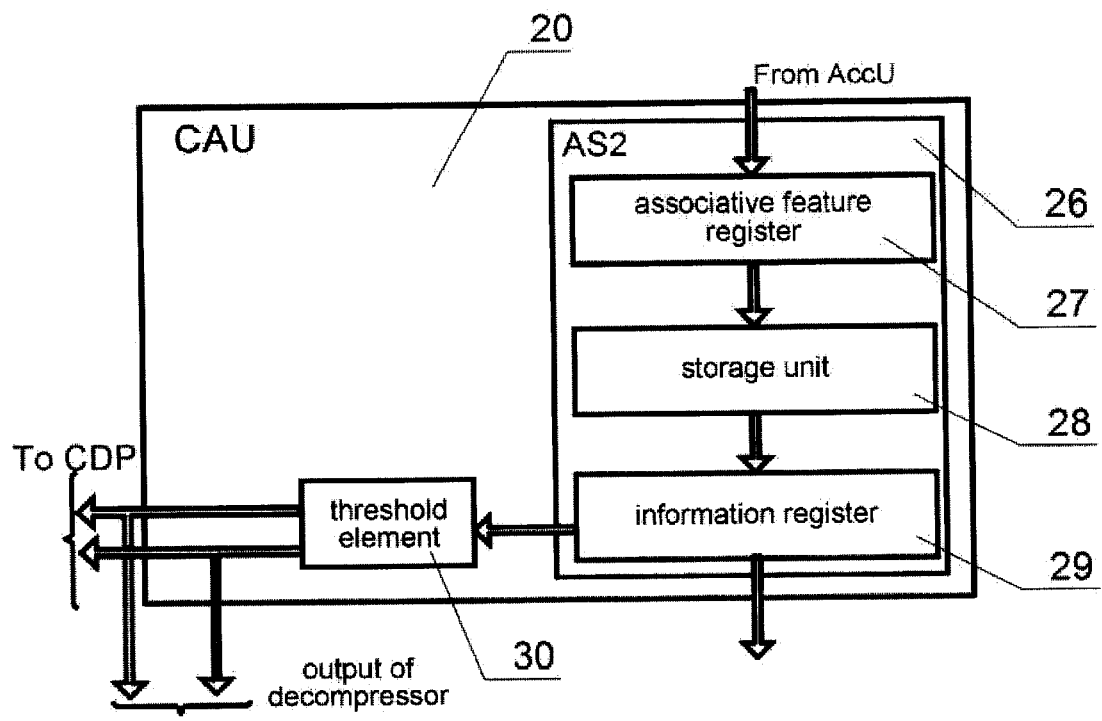

First associative storage ASI 18 (FIG. 5) consists of associative feature register 23, storage unit 24, information registers 25.

Code analysing unit (CAU) 20 consists of second associative storage AS2 26, designed similar to ASI 18, which, in turn, comprises search register 27, storage unit 28, information registers 29. Additionally, CAU 20 comprises threshold element 30 for the final determination of the chosen bit or byte of the serial or parallel code.

Figure 7:
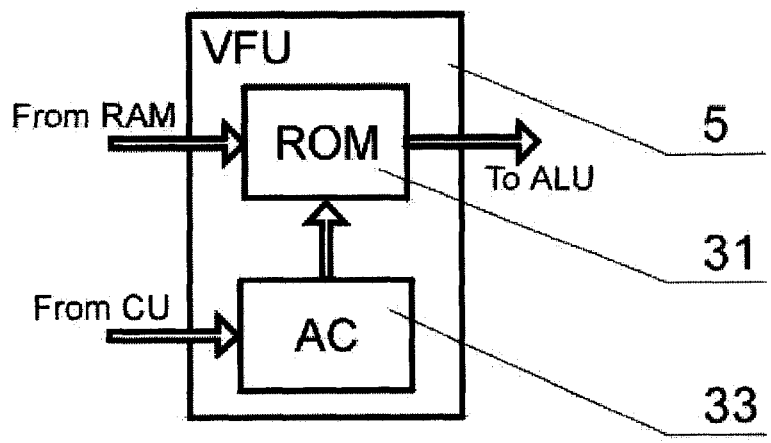
FIG. 7 illustrates the unit of forming codes of values of piecewise continuous Gaussian pulse with the use of a read only memory.
Figure 8:
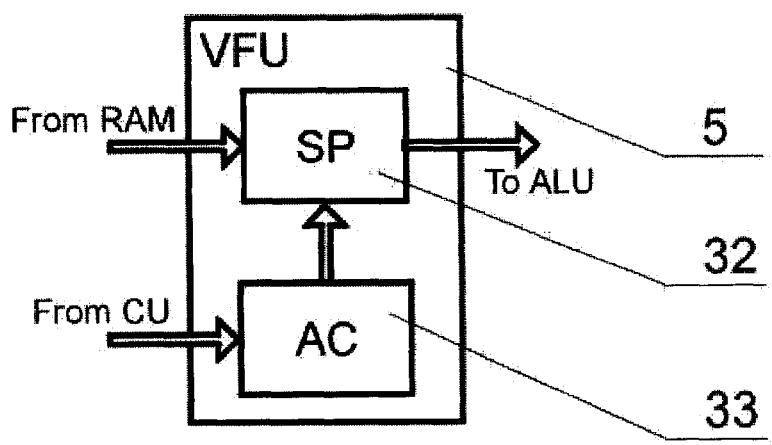
FIG. 8 shows the same, but with the use of a specialised processor to compute values of the piecewise continuous Gaussian pulse.
Figure 9:
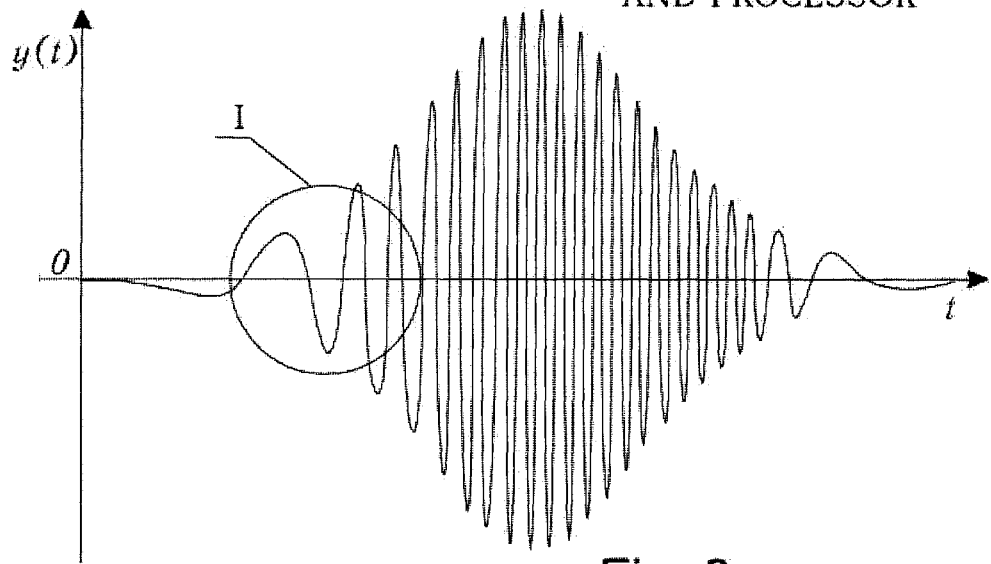
FIG. 9 shows a graph of the piecewise continuous aperiodic function, the section of which is used as a polynomial to translate the initial binary code.
Figure 10:
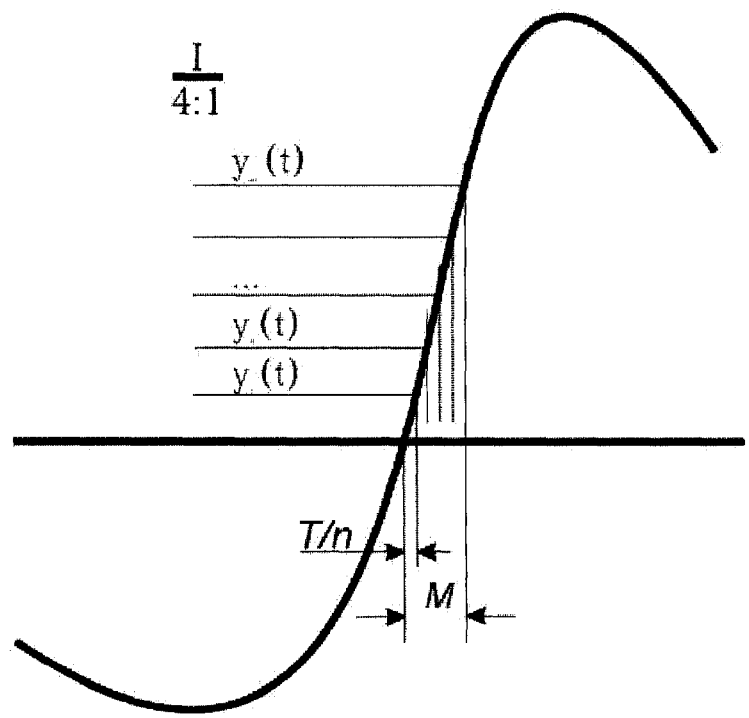
FIG. 10 shows the section of a polynomial function used to translate the binary code.

Unit of forming values of piecewise continuous Gaussian pulse (VFU) 5 consists of ROM 31 (FIG. 7) or specialised processor 32 (FIG. 8) and address counter (AC) 33 for questioning ROM 31 or processor 32 and presenting the next value of the piecewise continuous Gaussian pulse.

The method is effected as follows. The initial binary code, bit by bit or byte by byte, enters RAM 4 through input 1 (In1) or input 2 (In2) and is recorded therein with T time interval. Within the next T period each bit or byte is one by one connected through RAM 4 output logic 10 to the same name addresses of value forming unit VFU 5. Checking of addresses of VFU 5 is done by integrated address counter AC 33, which is started by the READOUT command from CU 7. As it is a matter of a binary code, so within each T period the permit input In1 of ALU 6 will have logical "0" or "1" n times. In accordance with this, from VFU 5, the value of code of piecewise continuous aperiodic function will be read out, with the same name as the input bit or byte. These values, in each T/n beat, come in turn to the first input of ALU 6, whereas the second input of which is fed by the same name values of bits or bytes of the non-compressed code from the RAM 4 output. ALU 6, in accordance with the operation algorithm, does the parallel bit by bit or byte by byte multiplication of initial code by the corresponding values of the predetermined function with subsequent algebraic summation of the values received. Since the piecewise continuous Gaussian pulse has the nature of variable sign, the ALU output values of compressed codes will also have a variable sign. The specified values are fed to DAC 3 which converts the digital code to the analogue one with the period of smoothing not exceeding the period of binary initial code. This will result in DAC 3 output producing a vibration close to harmonic, whereas one period of such vibration carries the information on 100 . . . 500 bits or bytes of non-compressed initial code. Further, this signal enters the channel of recording or information exchange. The parameters of the chosen piecewise continuous aperiodic function allow to enhance the transmissive capacity of the channel (track) used from 500 bits/s to 1 Hz of the spectrum width. Thus, the standard frequency band, used for regular phone channels, 3 Hz wide, allows to transmit about $1.5 \times 10^6$ bits per second.

The inverse conversion of the compressed signal to the initial code is effected as follows. The analogue signal comes from the channel of reproduction or information exchange to ADC 16, which converts the analogue signal to the compressed code. This code is fed to the first AU 17 input, to the second input of which the inverted code from CDP 15 is fed, as a result, a code value from the section of the polynomial function will be present at AU 17 output. As the length of the section makes m beats, whereas m is considerably less than n, and the compression is effected in series (bit by bit or byte by byte), AU 17 output will have, within each T period, one of $2^m$ values of the compressed code. Considering this algorithm, associative storage ASI 18 is designed, which, its input being fed by one of the 2m code values from AU 17 output, will have the decompressed values of the binary initial code at the output of information registers 25. Since the information transmission (recording) and the receipt (reproduction) are effected with the probability of an error other than zero, the code value received from the channel of recording (exchange) will differ from the compressed one. With this purpose, the code readout is done in ASI 18 with the help of search register 23 in accordance with the principle "THE CLOSEST TO THE INTEGER". Each decoded bit or byte value passes from ASI 18 output to AU 19 input, which consists of m sections of binary counters 21 and m decoders 22. In case of a serial binary code each value of the code bit from ASI 18 output is added only to the first counter of the unit of counters 21 and is shifted with summation from counter to counter within m beats: in case of compression of the parallel code (byte by byte) the binary code from each output of ASI 18 is bit by bit added to the corresponding counters of each unit of counters 21. Decoder 22 in each counter unit controls the summation of logical "1" in each counter within m serial beats, which results in the accumulation of the number of logical "1"equal to m beats in each counter of the marginal left counter unit after m beats. The contents of the counter summarising logical "0" should equal to zero. If the recording and reproduction channels (or communication channels) have noise variance the real contents of the counters will differ from the supposed. For example, if one of the m possible bytes to be compressed equals to 164, its binary presentation will look as 10100100. For example, if the length of the polynomial function section equals to 10, the contents of each counter when determination is over will look as 1010-0000-1010-0000-0000-1010-0000-0000 (in binary presentation). AS2 26 in each m beat analyses the contents of each counter and determines, by means of threshold element 30, the value of each bit in the decoded byte by the following rule: if the counter contents exceed or equal to (m/2)+1, then the bit value in the byte equals to "1"; otherwise, the bit value equals to "0".

The value of the bit or byte passes, from the CAU 20 code analysing unit output, to the output of decompressor 14 and, at the same time, to the input of CDP 15. Decompressor 14 CDP 15 structure is totally identical to compressor unit 1 CDP 2 and differs by the absence of VFU in RAM and by the number of elements equal to m.

Thus, the use of the supposed invention allows to solve the problem set, namely: to considerably enhance the data compression and decompression degree while preserving the reliability and productivity of the process, whereas the reliability of data transmission remains high when public phone channels are used.

What is claimed is:

1. In a method of compressing a binary code, the steps of
   receiving an initial binary code in a series of signal bits within a time interval;
   receiving values of an orthogonal coding function within said time interval;
   thereafter multiplying each said signal bit by a respective one of said values of the orthogonal coding function to obtain a series of product values;
   a summing of all of said product values within said time interval to obtain a compressed code, said method characterized in that said orthogonal coding function is in the form of a Gaussian pulse with a frequency filling.

2. The method of claim 1 wherein the Gaussian pulse with a frequency filling is transposed in accordance with an exponential law, and a phase at each point of an impulse is computed as an integral of the frequency filling, and using only a section of said Gaussian pulse approximated by a polynomial function with a polynomial degree not lower than four as said values of the coding function.

3. The method of claim 2, wherein the computation of the Duamel sequence is effected by a principle of superposition of the initial binary code and corresponding values of the Gaussian pulse.

4. The method of claim 3, wherein the initial binary code corresponds to serial values of a piecewise continuous Gaussian pulse, and the step of computing a Duamel sequence is done parallel-serially.

5. A parallel compression and decompression processor, comprising:
   a random access memory, said random access memory including an input logic for receiving uncompressed code, a multiple-order shift register coupled to an output of said input logic, and an output logic coupled to an output of said multiple-order shift register, said output logic supplying data as an output of said random access memory;
   a values forming unit for forming values of a piecewise continuous Gaussian pulse, said values forming unit coupled to receive the output of said random access memory;
   an arithmetic and logic unit coupled to receive the output of said random access memory and also coupled to receive an output of said values forming unit, said arithmetic and logic unit including a multiplier unit at an input of said arithmetic and logic unit, a summation unit coupled to receive an output of the multiplier unit and an output register adapted to provide an output of said arithmetic and logic unit; and
   a control unit for controlling operations of said random access memory, said values forming unit and arithmetic and logic unit, said control unit controlling the values forming unit to generate a coding function as a piecewise continuous function in a form of a Gaussian pulse with a frequency fill and to compute a Duamel sequence having as arguments data initially received by the random access memory and discrete values of the coding function.

6. The parallel compression and decompression processor of claim 5, wherein the values forming unit includes a read only memory for storing codes of values of a piecewise continuous Gaussian pulse in a form of tables; and an address counter for controlling a serial selection of values from the read only memory.

7. The parallel compression and decompression processor of claim 5, wherein the values forming unit includes a specialized processor for computing amplitudes of the piecewise continuous Gaussian pulse, said specialized processor operating parallel to a basic processor.

* * * * *